United States Patent [19]

Cooper

[11] Patent Number: 5,097,218

[45] Date of Patent: Mar. 17, 1992

[54] APPARATUS AND METHOD FOR MULTIPLYING THE FREQUENCY OF COMPLEX TIME VARYING SIGNALS

[76] Inventor: James C. Cooper, 1373 Sydney Dr., Sunnyvale, Calif. 94087

[21] Appl. No.: 404,881

[22] Filed: Sep. 8, 1989

Related U.S. Application Data

[63] Continuation-in-part of Ser. No. 172,283, Mar. 23, 1988, Pat. No. 4,868,428, which is a continuation of Ser. No. 16,923, Feb. 20, 1987, Pat. No. 4,829,257.

[51] Int. Cl.$^5$ .................. H03B 19/00; H03L 7/00
[52] U.S. Cl. ........................... 328/15; 328/16; 307/271; 307/529
[58] Field of Search .............. 328/14, 15, 28, 16, 328/20, 21; 307/529, 271

[56] References Cited

U.S. PATENT DOCUMENTS

| | | | |
|---|---|---|---|
| 3,296,517 | 1/1967 | Routh et al. | 307/529 |
| 4,053,839 | 10/1977 | Knoedl, Jr. | 328/14 |
| 4,524,326 | 6/1985 | Larson | 328/14 |
| 4,556,984 | 12/1985 | Genrich | 307/271 |

OTHER PUBLICATIONS

"Reference Data for Engineers", 6th ed. (Indianapolis, IN: Howard W. Sams & Co., 1968), p. 23-24.
Donald G. Fink, "Electronics Engineers' Handbook", (McGraw Hill, 1975) pp. 8-56-8-57.
Roger Harrison, "A Review of SSB Phasing Techniques", Ham Radio Magazine, Jan. 1978, pp. 52-63.
"RF/IF Signal Processing Handbook", Mini-Circuits, 85/86 ed., vol. 1, Section 2—pp. 4-7.

Primary Examiner—Stanley D. Miller
Assistant Examiner—Toan Tran

[57] ABSTRACT

The invention described herein provides an apparatus and method for accurately multiplying the phase or frequency of complex time varying signals by a given factor which may be non-integer.

13 Claims, 4 Drawing Sheets

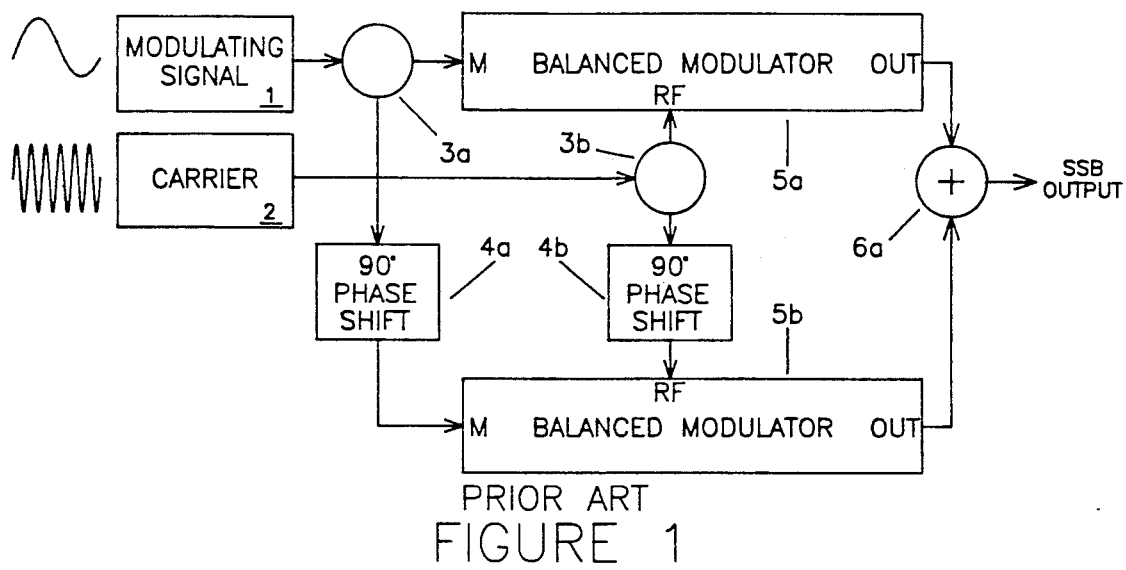
PRIOR ART
FIGURE 1
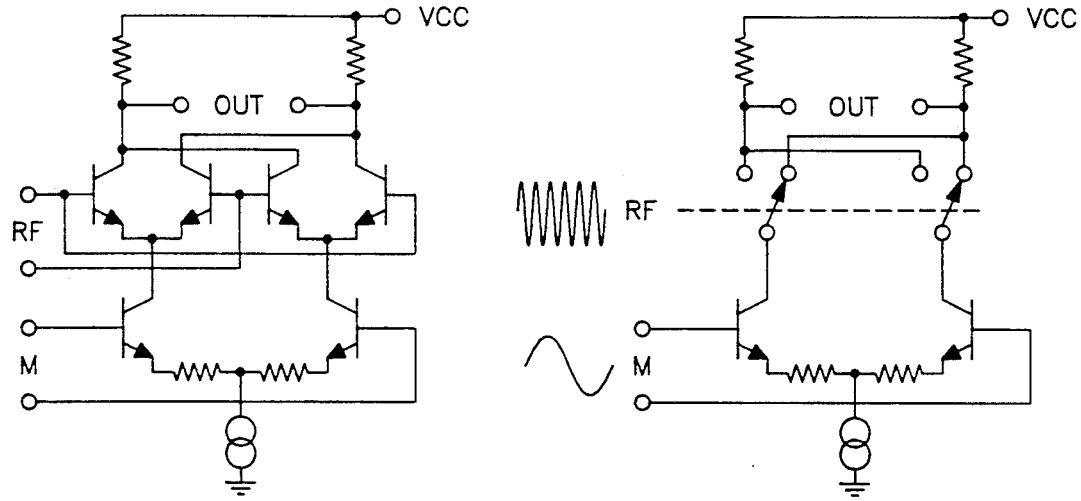
BALANCED MODULATOR 7
FIGURE 2A
EQUIVALENT CIRCUIT 8
FIGURE 2B
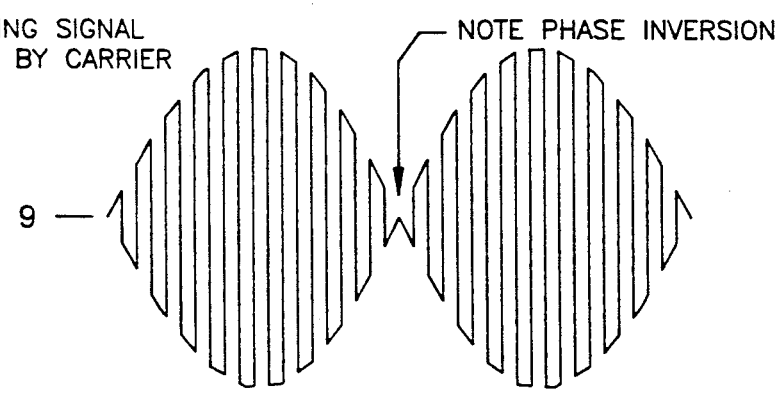
OUTPUT OF BALANCED MODULATOR 9
PRIOR ART
FIGURE 2C 5,097,218

APPARATUS AND METHOD FOR MULTIPLYING THE FREQUENCY OF COMPLEX TIME VARYING SIGNALS

The present application is a continuation in part of U.S. patent application Ser. No. 172,283, filed Mar. 23, 1988, now U.S. Pat. No. 4,868,428 issued Sept. 19, 1989 which is a continuation of application Ser. No. 07/016,923 filed Feb. 20, 1987, now U.S. Pat. No. 4,829,257, which applications are incorporated by reference. An understanding of the parent application, especially with respect to the description of FIGS. 1-5 which will aid in the appreciation of the inventive concepts described herein.

BACKGROUND OF THE INVENTION

1. Field of the Invention

The present invention relates to the field of multiplying the frequency of complex time varying signals of a repetitive or nonrepetitive nature. In particular the invention relates to adding the frequency or phase of one signal to another to multiply the frequency or phase of said other signal, or frequency addition.

2. Description of the Prior Art

Often in electronic system design, it is desirable to multiply the frequency of a given complex time varying signal, however no such circuitry is believed to exist which can directly achieve such a multiplication. As a result the complex time varying signal must be regenerated at a new frequency by various techniques such as tape recording at one speed and playing back at another, or digitizing the signal at a given rate with an A-D converter, buffering in memory and reconstructing the signal via a D-A converter at a different rate. These systems do not however, actually multiply the frequency of the signal, but rather time compress or expand the signal.

Single sideband modulators are known which have the ability of generating a sideband of a carrier in response to a modulating signal. In the SSB modulators, a fixed frequency carrier is modulated in a fashion to generate a sideband which contains both amplitude and frequency information of the modulating signal. Generally, these modulators are utilized to provide voice communications where the modulating signal occupies a voice bandwidth from a few hundred Hz to a few kilohertz. These modulators are useful only when the carrier is considerably higher in frequency than the modulating signal and in effect, shift the frequency of the modulating signal by the carrier frequency. These modulators are not useful for multiplying the phase of the carrier, or for providing slight frequency shifts to the carrier since the 90 degree phase shifter which operates on the modulating signal does not operate at low frequencies.

A SSB modulator is shown in block form in FIG. 1. It can be seen that a modulating signal 1 is applied to a splitter 3a where it is split and applied to the M input of a first balanced modulator 5a, and via a 90 degree phase shifter 4a to the second balanced modulator 5b. Similarly, a carrier signal 2 is split, and applied to the RF inputs of the balanced modulators 5a and 5b, with the second carrier input also being passed through a 90 degree phase shifter 4b. The two signals output from the outputs of the balanced modulators are combined in an adder 6a to create the SSB signal. Because the balanced modulators generate components at odd harmonics of the carrier frequency, a push pull vector type adder is often used for adder 6 in order to minimize the harmonic components. More information on SSB modulators can be found in "Reference Data for Radio Engineers" published by Howard W. Sams & Co, Inc. Indianapolis, Ind. 46268 Copyright 1968. Section 23 contains much information on modulators. An article by Roger Harrison, "A Review of SSB Phasing Techniques," Ham Radio Magazine, (January 1978), provides good information on the subject as well. It might be noted that all of the 90 degree modulating signal (audio) phase shifters shown in this prior art article are AC coupled and/or do not operate at DC. In contrast the present application teaches a method and apparatus to overcome this limitation.

FIG. 2a shows a schematic diagram 7 of a balanced modulator, along with the equivalent circuit 8, in FIG. 2b, a waveform of a typical output is shown in FIG. 2c. Note that the balanced modulator essentially switches the polarity of the modulating signal at the carrier frequency. In other words, the modulating signal is "chopped" by the carrier. No amplitude information of the carrier is passed by the switches, only timing (frequency) information. One wishing more information on balanced modulators, and SSB modulation can refer to the book by Donald G. Fink, "Electronic Engineers' Handbook", (McGraw-Hill, 1975), Section 8-77, is particularly useful.

Clearly, the SSB modulation scheme is not suitable for multiplying the frequency of a complex time varying signal by a small amount. It would be possible for the carrier frequency to be multiplied by the frequency of the modulating signal having a frequency within the passband of the 90 phase shifter, however no amplitude information on the carrier would be passed by the circuit, due to the switching nature of the balanced modulator. It could be said that the modulating signal is multiplied in frequency by the carrier, however the amount of frequency multiplication is many times the modulating signal frequency, and the system would not work at all for frequency shifts less than the modulating signal frequency. In addition, the SSB modulator generates spurious components at odd harmonics of the carrier frequency, due mainly to the fact that the balanced modulators are switching type devices, and the signal output from the output is essentially a square wave at the carrier frequency which is amplitude modulated. The SSB modulator is not useful for multiplying or controlling the phase of a carrier in any fashion partially due to the switching nature of the balanced modulators, and due to the limited bandwidth nature of the 90 degree phase shift network for the modulating signal.

SUMMARY OF THE INVENTION

The present invention described herein provides a means and apparatus for accurately multiplying the frequency or phase of a complex time varying signal without time shifting the signal, while preserving the amplitude information of that signal. The teachings may be utilized to multiply the frequency or phase of an amplitude modulated signal, thus creating a signal which is both amplitude and phase or frequency modulated. Various embodiments are taught which may be selected and optimized for particular applications. Embodiments which are capable of passing amplitude information of both a first and second signal which are added or multiplied in frequency are shown. Other embodiments teach means for precisely multiplying the phase of a carrier or complex time varying signal, and means for precisely multiplying the frequency of a carrier or complex time varying signal.

Other objects and a fuller understanding of this invention may be had by referring to the following description and claims, taken in conjunction with the accompanying drawings.

BRIEF DESCRIPTION OF THE DRAWINGS

FIG. 1 is a drawing of a prior art single sideband modulator.

FIGS. 2a and 2b are drawings of a balanced modulator. An equivalent circuit with typical waveform is shown in FIG. 2c.

DESCRIPTION OF THE PREFERRED EMBODIMENTS

Figure 3A:
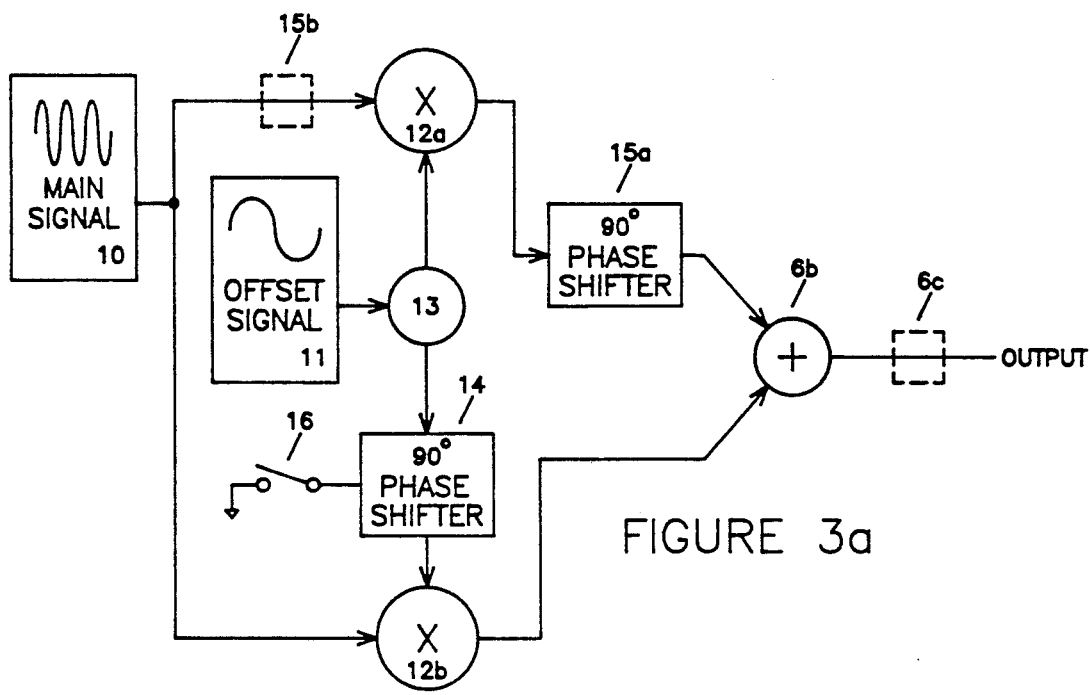
FIG. 3a is a drawing of a first embodiment of the present invention. A typical waveform is shown in FIG. 3b.

FIG. 1 shows a block diagram of a prior art SSB modulator which typically would be used with communications devices, showing modulating signal 1, carrier 2, splitters 3a and 3b, 90 degree phase shifters 4a and 4b, balanced modulators 5a and 5b and vector adder 6a.

FIG. 2a shows a schematic of a prior art balanced modulator 7, FIG. 2b. FIG. 2c shows the equivalent circuit 8 and a typical balanced modulator output waveform 9.

Figure 3B:
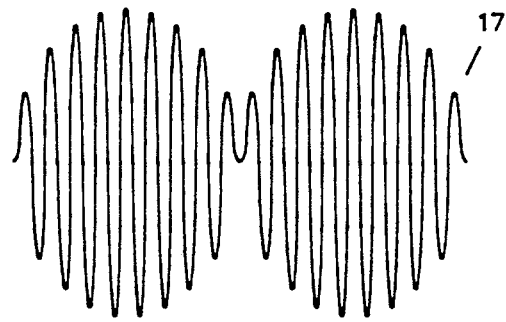

FIG. 3a shows a first embodiment of the invention having a main signal generator means 10, an offset signal generator means 11, portion generator means 12a and 12b, splitter means 13, offset signal ±90 degree phase shifter means 14, ±phase multiply control 16, main signal 90 degree phase shifter means 15a, alternate main signal 90 degree phase shifter means location 15b, vector adder means 6b and optional amplitude controlling means 6c. FIG. 3b shows a typical multiplier means output waveform 17.

Figure 4:
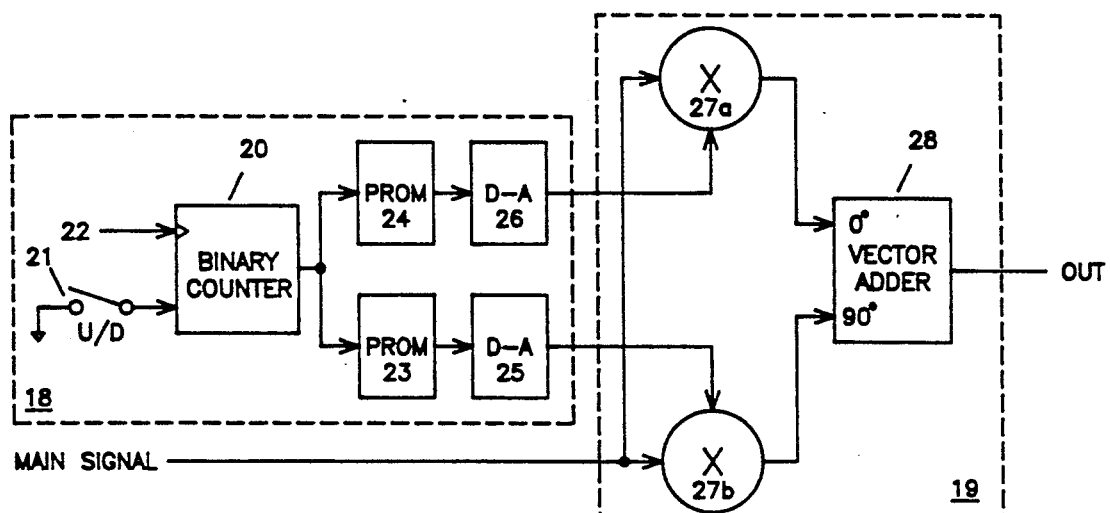
FIG. 4 is a drawing of a second embodiment of the present invention.

FIG. 4 shows a second embodiment of the invention having a offset signal generator means 18 comprised of digital counter 20, up down control 21, clocked signal 22, sine lookup 24, cosine lookup 23, D-A converters 25, and 26; and main signal combiner means 19 comprised of portion generators 27a and 27b and vector adder 28.

Figure 5:
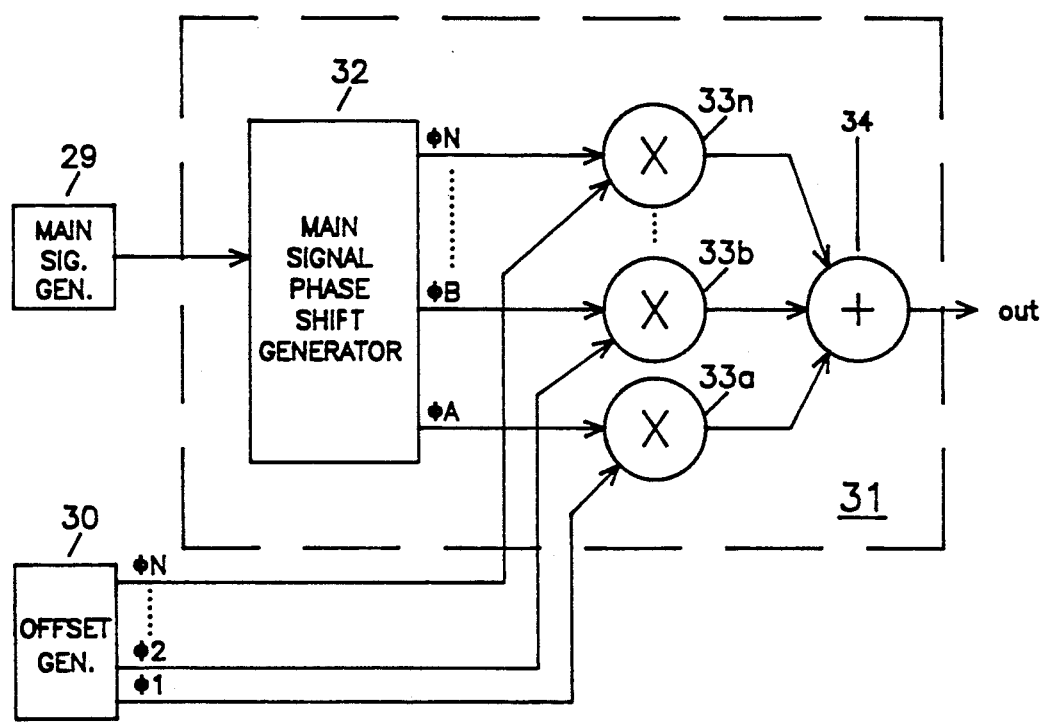
FIG. 5 is a drawing of a third embodiment of the present invention.

FIG. 5 shows a third embodiment of the invention having a main signal generator means 29, an offset signal generator means 30, and a main signal combiner means 31 comprised of main signal phase shifter 32, portion generators 33a thru 33n and vector adder 34.

Figure 6:
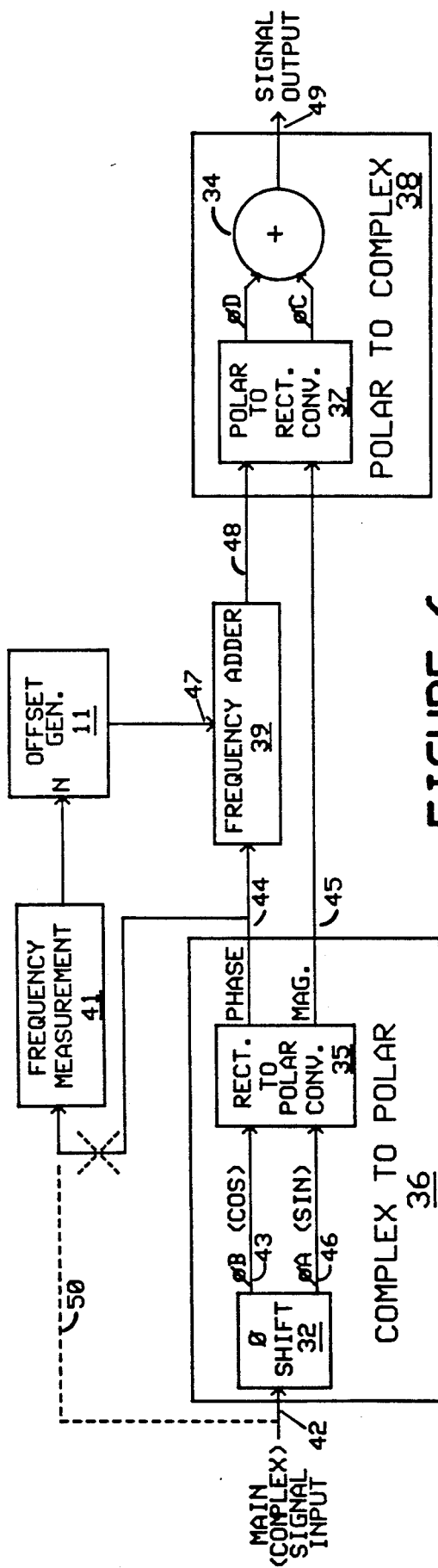
FIG. 6 is a drawing of a fourth embodiment of the present invention.

FIG. 6 shows a frequency multiplier responsive to input signal at 42 and providing an output signal at 49 having complex to polar conversion means 36 providing phase signal 44 and magnitude signal 45, containing phase shift means 32 providing signals 43 and 46 and rectangular to polar convertor 35, frequency adder means 39, offset generator means 11 providing offset signal 11, frequency measurement means 41 having alternate input connection 50 and polar to complex conversion means 38, containing polar to rectangular conversion means 37 and vector adder means 34.

Figure 7:
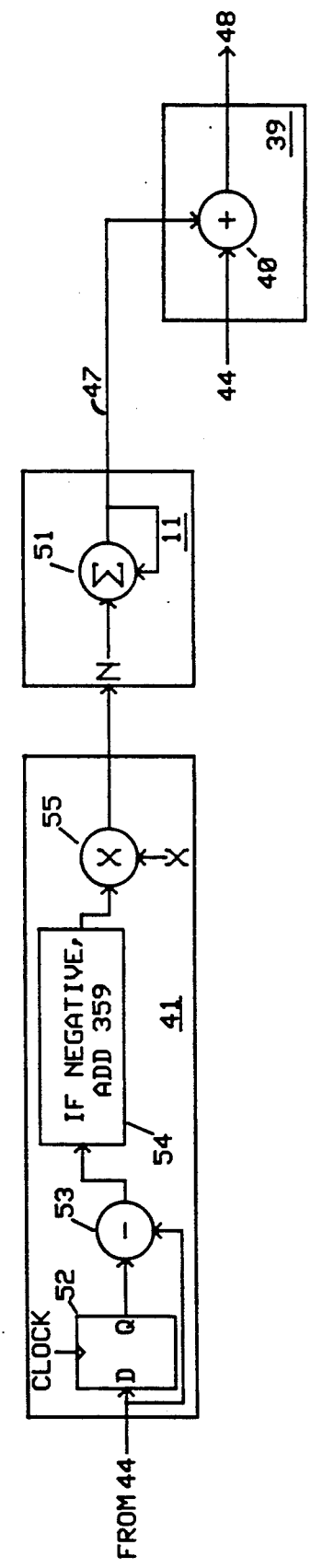
FIG. 7 is a detailed drawing of part of FIG. 6.

FIG. 7 shows details of frequency measurement means 41 having delay 52, subtractor 53, logic function 54, and multiplier 55, offset generator means generating offset signal 47 and containing accumulator 51, and frequency adder means 39 responsive to phase signal 44, providing signal 48 and having adder 40.

One of the main shortcomings of the SSB modulator circuit is that the balanced modulator which it utilizes is a nonlinear device with respect to the carrier or RF input. Because of this nonlinear operation, odd order harmonics of the carrier are generated, and in addition, no amplitude components of the carrier are passed. These features may be desirable for SSB operation, however it makes the circuit unusable for complex time varying signal frequency addition. The SSB modulator will not provide frequency multiplication where a given signal is multiplied in frequency by a given factor.

FIG. 3 shows a first embodiment of the present invention which is similar in appearance to the SSB modulator of FIG. 1, however the operation is much changed by the replacement of the balanced modulators by portion generator means which in the preferred embodiment are comprised of linear four quadrant multipliers. Such multipliers are common components in the art, and are even available in integrated circuit form. A typical IC which is suitable for the multiplication function is the MPY634 manufactured by Burr-Brown of Tuscon, Ariz. Several other manufacturers make IC multipliers as well, and the proper selection of a particular component to perform the multiplication function depends on operating frequency, accuracy and other parameters which will become obvious from the present teachings.

Another component which can be utilized for the portion generator function is a doubly balanced mixer which is constructed utilizing diodes for the switching function. This component is normally utilized to provide a switching function similar to that of the balanced modulator, however if the signal levels into the mixer are kept to very low levels, in order to not saturate the diodes or transformers, the balanced mixer will operate as a fairly linear multiplier, and can be utilized for this function. One balanced mixer which has been successfully utilized is the MCL SBL-1 manufactured by Mini-Circuits of Brooklyn, N.Y. This manufacturer also provides detailed literature on the use of these components. This component is relatively insensitive to frequency variations, having a carrier or RF bandwidth of 1–500 MHz and a modulation signal or IF bandwidth from DC to 500 MHz. The DC capability of the modulation signal input is quite important as will become apparent from the present teachings. The portion generators operate to output a signal whose frequency is determined by the main signal and whose amplitude is determined by the offset signal.

The operation of the invention of FIG. 3 is such that portion generator 12a operates on the main signal in response to the offset signal such that the amplitude of the output main signal is controlled by the absolute value of the offset signal, and the phase, or polarity of the output signal is controlled (in the present embodiment inverted) when offset signal is negative, the maximum amplitude may be greater, equal to, or less than the main signal, thus providing an output shown typically by 17. Vector adder 6b operates to combine the two signals which are input to it in additive fashion so that the output is the vector sum of the two inputs. In some applications it may be desirable to add buffering, amplification, AGC, limiting or other action to this vector adder or to the portion generators for proper coupling to subsequent circuitry or to otherwise improve circuit performance. In particular, where constant amplitude is desired, a limiter or AGC circuit of a type known to those skilled in the art could be included, as shown by 6c.

For the present disclosure the portion generator means will be described by way of example as if it is a linear multiplier, which is the preferred embodiment, however it will be understood by one skilled in the art that it may take on several other embodiments including balanced modulator, and balanced mixer, in both analog and digital versions.

The 90° phase shifter 15 could be included as part of the vector adder circuit. A particular device which has been successfully utilized to perform both the phase change function 15 and the vector combination function 6b is the MCL PSCQ-2-50, manufactured by Mini-Circuits, which is a 2 way 90° power splitter/combiner. Power splitters of this type are also referred to as hybrid splitters, and generally work equally well as combiners. The 90° phase shifter 15a could also be located at the position shown as 15b. It should be noted that it is necessary to combine portions of the main signal which are relatively phase changed. These functions may be performed in any sequence, and the invention will work equally well. For example, the main signal may be phase changed, then multiplied then combined, it may be multiplied, then phase changed then combined, or it may be combined and phase changed in the same operation, as with the use of the suggested PSCQ-2-50. The main signal may even be combined and multiplied in the same operation with a multiple input multiplier or other multiple gain or control device. One such device is the Analog Device's AD539 which has dual signal channels and a common control channel.

The phase inversion of the main signal, as shown by 17, should be noted, which inversion takes place during the negative portion of the offset signal. Multiplier 12b performs an identical function to 12a, but operates on the main signal in response to the offset signal which has been changed by either ±90 degrees by 14. It should be noted that the sum of the outputs from 12a and 12b when combined in 6b is constant, which can be recognized by inspecting the outputs when each offset signal (at the input of the multiplier) is zero. When 12a's input is 0, 12b's is at maximum. Conversely when 12b's input is 0, 12a's is maximum.

Consider now the situation when the offset signal input to 12a is at 0.707×the maximum (0.707=sine 45 degrees). The offset signal input to 12b will also be 0.707×the maximum since the offset signal which is phase changed by 90 degrees by 14 will also have that same value (sine 45 degrees=sine 90+45 degrees). The output of 12a is phase changed by 90 degrees of the main signal period by 15a, and then combined with the output of 12b in the combining means 6b. It will be recognized with a little study that the vector sum of the two multiplied main signals is a signal at the maximum amplitude, but phase changed by 45 degrees with respect to the main signal output from 12a (0.707Δ0+0.707Δ90=1Δ45). From the present explanation it will be apparent to one skilled in the art that as the offset signal is changed in phase, the portions of the main signal which are passed by the multipliers is changed in order to provide a continuous phase change to the main signal.

Following the phase sequence of the offset signal, assuming it is sinesoidal and assuming that the maximum values of both the offset signal and main signal are ±1, making the value of the signal input to 12a and 12b equal to the value of the sine and cosine respectively of the phase angle of the offset signal output from 11 gives the following:

| phase of offset signal | value of 12a input | value of 12b input | phase of 6b output |
|---|---|---|---|
| 0 deg. | 0 | 1 | 0 deg. |
| 45 | .707 | .707 | 45 |
| 90 | 1 | 0 | 90 |
| 135 | .707 | −.707 | 135 |
| 180 | 0 | −1 | 180 (or −0) |
| 225 | −.707 | −.707 | 225 |
| 270 | −1 | 0 | 270 |
| 315 | −.707 | .707 | 315 |
| 360 | 0 | 1 | 360 (or 0) |

One of the inventive concepts of the present invention is that the phase of the main signal output from 6b corresponds to the value or phase of the offset signal. In addition, since multipliers may be utilized for 12a and 12b, the operation therefore may be linear with respect to amplitude which allows complex main signals to be operated on without destroying the amplitude information contained thereon. The invention therefore has the ability to impart a precise and continuously adjustable phase change to the main signal. Complex offset signals may also be used.

Another inventive concept to note at this point is that the phase change which is applied to the main signal is continuous, that is there is no end to the amount of phase changing which may be imparted to the main signal. If the offset signal is a continuous sinesoidal signal, the signal output from 6b is continuously phase changed, which is the same as a frequency offset. In other words, the frequency of the offset signal is subtracted from the main signal. Thought of in another way, the invention can add a constantly accumulating phase change to the main signal.

The 90 degree phase change 14 is provided with a control 16 which selects either a positive or a negative 90 degree shift. This control in effect inverts the polarity of the offset signal input to 12b, thus inverting the polarity of the main signal output from 12b. The overall effect of such a polarity change is to cause the phase of the output from 6b to correspond to the inverse of the phase of the offset signal. In terms of frequency, this means that the frequency of the offset signal is added to the main signal. It will be understood by one skilled in the art that the change from adding frequency (or phase) to subtracting frequency (or phase) may be performed as well by changing 15 to a −90 degree phase shift, or by inverting any of the signals input to or output from the multipliers in order to achieve the opposite polarity of vector addition.

Stated in other words, the laws of trigonometry may be applied to the phase shifts and signal inversions described in the present teachings to achieve the proper vector results. Also, the invention may be utilized where phases are represented by magnitudes, as will be discussed later. It may be noted that there are numerous combinations of phase shifts and inversions which may be resorted to, as well as several trigonometric identities and equalities and operation in other systems, such as with polar representation, which may be utilized in configuring the circuitry or steps of methods of practicing the invention as taught herein. From the teachings herein, one skilled in the art will be capable of making use of these aforementioned combinations to optimize the circuitry or steps to fit a particular application. It will be understood that in the claims and present disclosure, the recitation of a particular combination of functions is given by way of description or example and is meant to include the various alternative combinations mentioned above, as well as the specific combinations and arrangements given herein.

FIG. 4 shows another embodiment of the invention in which the offset signal generator means 18 generates two signals in quadrature phase which are applied to a combiner means 19. Combiner means 19 contains portion generators 27a and 27b corresponding to 12a and 12b of FIG. 3 in function. Combiner means 19 also contains a vector adder 28, which corresponds to 15 and 6b of FIG. 3 as was previously discussed. The two quadrature signals from 18 are suitable coupled to 27a and 27b of 19 as is the main signal. The outputs of 27a and 27b are combined in the vector adder 28, which also performs the equivalent of the 90 degree phase change corresponding to 15 of FIG. 3a. The output of 28 is the phase changed main signal corresponding to the output of 6b of FIG. 3a. The output signals of 18 are presently described in quadrature relationship which is the preferred form of the embodiment, however other phase angles may be used as well as will be apparent to one skilled in the art from the present teachings.

The offset signal generator means used in this application is one of the inventive concepts of the present embodiment of the invention. The design of the offset signal generator is such that it may provide signals in quadrature at varying phase or frequency. The control of the preferred embodiment shown here by way of example is by a clock 22 and up/down 21 digital signals. These signals are provided either internally or from other functional means as will be discussed by way of example with respect to FIGS. 6 and 7. For the purpose of explanation of the present element 18, it will be assumed that the clock may be started or stopped at will, and is variable in frequency, and that the up/down signal may be changed as needed. It will be understood that the up/down signal has the same effect as changing the control 16 of FIG. 3a, and that the clock signal has the same effect as changing the frequency of the offset signal of 11 of FIG. 3.

Both the clock and up/down signals are applied to a binary counter 20 which counts clock pulses in binary sequence either up or down in response to the state of the up/down signal. One such device is the 74LS491 IC manufactured by Monolithic Memories of Santa Clara, Calif. The parallel digital outputs from the counter (which number 10 in the example of the 74LS491) are coupled to the address inputs of two programmable read only memories (PROM) 23 and 24 in which are stored the binary value of the sine and cosine of the particular digital word applied to their address inputs. Numerous PROM IC's are available which may be utilized for 23 and 24, and ROMs which are already programmed with the sine and cosine values are available under part number AM29526-AM29529 from Advanced Micro Devices of Sunnyvale, Calilf. Thes devices provide 16 bit accurate values for 0–180 degrees with 2048 bit phase accuracy. Trigonometric identities can easily be utilized by one skilled in the art to arrive at the values for 180–360 degrees and properly utilize these parts. For example, for these parts sine n = —sine n—180 degrees and cosine n = —cosine n—180 degrees.

The combined operation of the counter 20 and PROM's 23 and 24 is to provide digital sine and cosine values for each clock pulse of 22. The configuration is such that for the suggested 74LS491 there will be 2 exp. 10 values of sine and cosine which represent 1024 values per 360 degrees. The phase resolution of the combination is thus 360 degrees: 2 exp. 10 where n is the size of the counter 20. In the present example n=10 and the resolution is 0.35 degrees. If the counter 20 is caused to count down by 21, this will have the effect of inverting the cosine output with respect to the sine output.

The digital values of sine and cosine are applied to digital to analog converters (D-A) 26 and 25 respectively, where the digital value is converted to an analog value. D-A converters are manufactured by several IC manufacturers, and two such devices which may be utilized are the ADC1025 and the DAC0800 by National Semiconductor. The analog value from each D-A is coupled to the combiner means 19. From the present explanation and example, it will be apparent to one skilled in the art that the offset signal generator means 18 provides quadrature or other phase related signals with very good and predictable phase resolution. It will be further apparent that the phase resolution and frequency of the signals output from 18 are precisely controlled by the clock 22 and up/down 21 signals. Recalling the previous explanation of FIG. 3a, it will now be further apparent that the phase of the main signal which is output from 19 will be precisely controlled in both phase and frequency by 21 and 22. Of particular note is the ability of the embodiment of FIG. 4 to change the phase of the main signal by extremely fine increments, in the present example 0.35 degrees. If 16 bit counter PROMs and D-A's were utilized for 20, the phase increment would be 0.005 degree. It should also be noted that the phase changing may be continuous, at fast, or slow rates, or intermittent rates, or may reverse direction, all in response to 21 and 22. Of course the above abilities also mean that the main signal may be multiplied in frequency by very small or very great amounts, or even by varying or non-uniform amounts, all in response to signals 21 and 22.

Other arrangements of the offset signal generator means may be utilized as well, for example, multiple counters 20 may drive different PROMs, having the same data, with the phase offset being accomplished in the counters. One counter may also be utilized to drive different PROMs, with the counter output having the phase change added to it, for example by inverting one or more bits, such as the MSB, as part of coupling to the PROM.

It is important to note again that if 27a and 27b are linear multipliers, the main signal may be complex in nature, and will not be clipped or distorted by the device. If however it is not necessary to pass any amplitude information, nonlinear devices such as the balanced modulators of the prior art may be utilized for 27a and 27b. The output of 28 will then contain spurious harmonic components which will probably need to be filtered out of the signal for most applications. The resultant circuit will then provide the capability of precisely phase changing or frequency multiplying the main signal in response to the clock and up/down signals, but without passing any amplitude information.

Accurate frequency multiplication and phase change of a main signal by the present invention can be extremely useful. The invention is considerably simpler than phase locked loops, providing precision control with fewer parts, especially for very small or very large shifts. As one example of the usefulness of the invention, consider the problem of locking a high stability signal source such as a crystal oscillator at 39.000 Mhz to another source which is very close in frequency such as a second crystal oscillator at 39.001 Mhz. Prior art techniques utilize PLL's which are complex and generate large amounts of phase noise compared to the crystal. Tunable crystal oscillators are available, however they are not nearly as stable as fixed frequency oscillators, and they can not be tuned very far, 0.5% being a practical limit before serious difficulties are encountered. With the use of the present invention, a fixed frequency and therefore highly stable oscillator at 39.000 Mhz can be added to a 1 Khz signal to achieve a frequency and phase lock to the 39.001 Mhz signal. The output will have the basic phase noise and stability characteristics of the 39.000 Mhz oscillator but will have the tunability range of a PLL, all with fewer parts and lower cost. The embodiment of FIG. 4 can perform just such a task.

The embodiment of the invention of FIG. 4 may be expanded to include more offset signals in order to improve the phase control accuracy of the invention. In the invention of FIG. 4, if there are any imperfections in the portion generators 27a and 27b, that imperfection contributes considerably to the output signal, especially when the offset signal to the other portion generator is zero. By increasing the number of portion generators, and phases of offset signals, the contribution of error to the output signal is decreased since more than one portion generator will contribute to the output at all times. Such an embodiment of the invention is shown in FIG. 5.

FIG. 5 shows a main signal generator 29 coupled to a combiner means 31 similar to 19 of FIG. 4, except it contains multiple portion generators 33a-33n. The outputs of 33a-n are combined in vector adder 34 to provide the phase changed main signal output. FIG. 5 also shows offset generator 30 which provides multiple phases of the Offset signal $\phi A$ thru $\phi N$. These multiple phase signals are coupled to the multipliers 33a-n similar to the outputs of 25 and 26 of FIG. 4. Such an offset signal generator can be constructed with the technique of 18 of FIG. 4 by utilizing multiple PROMs and D-As with each PROM and D-A pair generating one phase. Particular attention should be given to embodiments which operate with three offset phases spaced at 60 degrees, and 4 offset phases spaced at 45 degrees. The operation of the embodiment of FIG. 5 is very similar to that of FIG. 4, and one skilled in the art will be able to construct and practice this embodiment of the invention from the present teachings.

FIG. 6 shows a fourth embodiment of the present invention which utilizes a conversion of the main signal into polar coordinate form to facilitate the frequency multiplication. FIG. 6 has a complex to polar conversion means 36 which receives the time dependent main (complex) signal at input 42, and converts it to equivalent polar (phase and magnitude) signals 44 and 45. The phase and magnitude signals 44 and 45 are also a polar representation of the two phase shifted version signals, $\phi A$ and $\phi B$ which are rectangular coordinate (real and imaginary) equivalents of the main signal.

The complex to polar conversion means 36 may be constructed utilizing a phase shift means 32 which may be the same as 32 of FIG. 5, which provides 90° phase shifted versions of the input signal from 42. These 90° versions, 46 ($\phi A$) and 43 ($\phi B$), may be thought of as the aforementioned real and imaginary rectangular coordinate version of the input. The real and imaginary signals are coupled to a rectangular to polar coordinate converter means 35, which transforms these signals to polar phase and magnitude form. A suitable I.C. for the rectangular to polar converter means is the TMC2330 manufactured by TRW LSI Products of La Jolla, Calif. This I.C. accepts the real and imaginary signals input in digital form, and outputs angle and magnitude signals, also in digital form. The I.C. can also be configured to perform the reverse function, i.e. it accepts angle and magnitude signals as inputs, and outputs real and imaginary signals. One skilled in the art will recognize that the phase signals $\phi A$ and $\phi B$, which are output from 32, will need to be in digital form compatible with the TMC2330, however the construction of suitable A-D convertor circuits, in the event of an analog signal output from 32, will be well within the skill of one of ordinary skill in the art. Of course, a digital version of 32 may be utilized, such as a circuit based on a Hilbert transform.

One skilled in the art will recognize, from the above description, that amplitude information of the main signal at 42 is contained within the magnitude signal 45, and phase or frequency information of the main signal at 42 is contained within the phase signal 44. By multiplying the value of 44 at any given instant, the phase information is multiplied, thereby effecting a phase shift. Similarly, if the rate of multiply, or in other words the frequency of the phase signal 44 is multiplied, the effect is to multiply the frequency content of the main signal, without affecting the amplitude. Such frequency multiplication may be made with a frequency adder 39, which in the preferred embodiment takes on the configuration shown in FIG. 3a, wherein the main signal 10 of 3a is the phase signal 44, and the offset signal from 11 of FIG. 3a is provided by a like offset generator 11 of FIG. 6, which may alternatively operate with a frequency synthesizer means 41. The frequency adder means 39 outputs 48, a phase or frequency shifted version of the phase signal 44. Signal 48 is thus an altered version of phase signal 44.

It should be noted here that the phase shift 15a of the main signal will be somewhat different than that which normally comes to mind. Since phase (of the input signal) is carried by signal 44 as a magnitude or value of signal 44, a phase shift of the input signal corresponds to a magnitude or value change of 44. The shifting of phase corresponding to that represented by 15a, now becomes simply the addition or subtraction of the magnitude representative of 90° to signal 44. It should also be noted that this operation, i.e. addition or subtraction of a magnitude, can be carried out with simple analog or digital sum or subtract circuit. This ease of phase shift has a very beneficial effect on the operation of the frequency adder 39, which will be discussed later.

The altered or frequency shifted signal 48, output from 39, becomes the new phase signal which is recombined with the magnitude signal 45 by the polar to complex convertor means 38. Means 38 operates to generate an output time dependent signal from 49 which is derived from the altered phase and magnitude signals 48 and 45, which output signal from 49 contains the same amplitude information as input signal 42, but is frequency shifted by the amount of frequency added in 39. Means 38 may be simply made up of a polar to rectangular convertor means 37, such as the previously mentioned TRW TMC2330 I.C. which converts the phase and amplitude signals 48 and 45 to real and imaginary signals $\phi C$ and $\phi D$, which may be thought of as altered rectangular signals. The altered rectangular signals are then combined in a vector adder means 34, similar to 6b of FIG. 3a or 28 of FIG. 4. The output signal at 49 is therefore a frequency shifted version of the input signal, with the frequency conversion being controlled by the frequency adder 39.

As previously mentioned, the effect of phase shifting the main signal at 42 via the frequency adder 39 is simply a function of adding that magnitude corresponding to the desired phase shift to the magnitude of 44. If 44 is representative of a continuously changing signal, that is one having a frequency content, then the magnitude or value of 44 will be constantly changing at a rate corresponding to frequency of 42. By way of example, assume that the input signal at 42 is a sinesuoid having an amplitude of one volt, and a frequency of 1 Hz. Further, assume that the phase signal 44 may take on a value from 0–359 arbitrary units corresponding to a phase of 0°–359° of the input signal at 42. The signal 44 will then count continuously from 0–359, roll over to 0 and count to 359 and so on as the input signal changes amplitude in time. The phase signal 44 will cycle from 0–359 at the 1 Hz rate of the input signal. To multiply the phase of the input signal, as represented by the phase signal 44 at any instant, it is sufficient to merely add a value to that instant value to 44. Since 360 degrees of phase of the input signal at 42 corresponds to a value of 360 at signal 44. a 90° phase shift will correspond to a value of 90. In order to provide a 90° phase shift, adding a value of 90 to signal 44 in a modulo 360 adder will accomplish this phase shift.

Since frequency is the continuous accumulation of phase shift, a frequency offset may be made by adding a continuously accumulating value to 44. The addition of a continuously accumulated phase value is what happens in FIG. 3a when the phase shift 15a and vector adder 6b operate. Similarly, when these elements are configured to operate in domain of signal 44, namely in the domain where phase is represented by magnitude, as in FIG. 6, one skilled in the art will recognize from this disclosure, that the frequency adder 39, as represented by 3a, is reduced simply to a magnitude addition function.

Since the conversion functions 35 and 37 may be readily implemented by the TMC2330 in digital form, a digital accumulator function such as the TRW TMC2208, which contains both an accumulator and adder, will be useful as a building block for the frequency adder 39, and the offset generator 11. A digital adder 39, combined with a digital accumulator implemented offset generator 11, is shown in FIG. 7. Alternatively, the phase accumulator function of 51 may be implemented by a common digital counter, or by a more complex numerically controlled digital oscillator.

FIG. 7 shows the combination of 41, 11 and 39 in more detail.

The frequency measurement means 41 contains a delay 52, in the present example represented by a digital delay composed of a clocked shift register, such as a 74HCT374, a subtractor 53 such as can be constructed from a 74HCT283 to subtract the undelayed signal 44 from the delayed version, a logic circuit 54 which can be constructed from a read only memory, which is programmed to add 359 to the output of 53, if that output is negative, thereby outputting a difference signal which is positive, and which corresponds to the change of the phase signal 44 over the delay time of 52. It should be noted that 53 and 54 make up a modulo 360 subtractor. The difference output from 54, which corresponds to the frequency of signal 44, is multiplied by a constant X by multiplier 55 such as a TRW MPY016k, to provide the constant N utilized by the offset generator 11. The constant N is not actually constant when provided by 41, rather it is a frequency signal representative of the frequency of 44. Offset generator 11 contains an accumulator 51, which operates in the present example as a modulo 360 accumulator, that is if the output of 51 is 359, and N has a value of 1, the next output of 51 will be 0. It should be noted that the modulo 360 number for subtractor 53 and 54, accumulator 51 and adder 40 is arbitrarily chosen for the purpose of explanation, and in actual practice a binary number such as $2^{16}$ is a more practical choice. The output of 51 is coupled to the frequency adder 39 which contains a modulo 360 adder 40. Like the accumulator 51, the maximum output of 40 is a value of 359. It will be assumed again for the purpose of the present example, that signal 44 will have a value ranging from 0 to 359, corresponding to a phase of 0 to 359 degrees.

Since phase shifting is accomplished by magnitude multiplies, a simple finite size adder 40 accomplishes this function. Recalling that an accumulated phase shift corresponds to frequency shift, a phase accumulator 51, which may be implemented for binary modulos as suggested by the aforementioned TMC2208, is shown. A phase offset is accomplished in offset generator 11 by coupling a constant value N to the accumulator long enough to accumulate the proper phase shift. When the proper phase shift is achieved, the constant N is returned to 0. Such control may be provided as a circuit component of larger systems which will not be shown here in detail. For a continuous phase shift, a constant value N is maintained at 51, causing this value to be constantly accumulated by 51, thereby providing constant phase accumulation which in effect is a frequency shift. It is important to note that a constantly accumulating (increasing or decreasing) value 47 output from 11 corresponds to a frequency shift applied to the signal 44 by frequency adder 39. The rate of multiply of the magnitude of the value output by 11 is determined by the value of N, and corresponds to the magnitude of the frequency multiply. The frequency multiply imparted to 44 by 39 is therefore responsive to the value of N.

The ability to provide a frequency shift in response to a fixed value, with the amount of frequency shift corresponding to that value, gives rise to the ability to multiply the frequency of the phase signal 44 by any factor, including fractional and non-integer values! Such frequency multiplication is simply effected by providing a frequency measurement means 41 which outputs a value of N in response to the frequency of the phase signal at 44, which represents the frequency of the input signal at 42, or alternatively in response to the input signal itself, as represented by the dashed line 50 between 42 and 41.

As an example, consider that the frequency measurement means 41 measures the phase change of phase signal 44 with respect to time, or in the present digital example, with respect to the clocking signal which clocks 35 which is time related. For the purpose of the present example, we may assume that the clock frequency is 1 KHz is applied to 52, and the rate of change of the phase signal 44 is 360 degrees per 1000 clocks, corresponding to a frequency of 1 Hz. The frequency measurement means 41 will then output a value of N which will be assumed in the present example to cause the offset generator to output an offset signal which cycles at a given rate, for example 0.1 HZ. The frequency adder will then add 0.1 Hz from 47 to the 1 Hz frequency of 44, giving a 1.1 HZ signal 48. The net effect is then that of offsetting the 1 HZ phase signal by 10%. As with the previous examples, the offset may be chosen to be positive or negative, by changing whether the adder 40 adds or subtracts the offset, and adder 40 may be configured to do either as is desired. If 40 were to subtract the offset from 44, a 0.9 HZ signal would result.

Now assume that signal 44 changes frequency to 5 HZ. The phase change with respect to time will be 5 times greater, which in turn generates a 5 times greater value for N, which in turn generates a 0.5 HZ offset signal 47 which is added to 44, giving a 5.5 Hz signal for 48. The input signal has increased in frequency by 5X but the frequency offset given by the apparatus of FIG. 6 is still 10%. The above described operation amounts to frequency multiplication by a non-integer amount.

One skilled in the art will recognize that the value of X applied to 55 of 41 controls the amount of offset provided by 11 and 39, for a given frequency of the input signal, by providing a gain or scaling factor for N. In the above example of a 10% offset, if X were doubled, the offset would be changed to 20%. If X were made negative, the offset would be changed to −10%.

One skilled in the art will recognize that the above described functions and components are somewhat more complex than represented by the present block diagrams, however from the disclosure herein, taken with the available applications literature available from the manufacturers of the suggested components, or from other components which may be substituted as will be known from the above disclosure, the construction of a practical and operable device will be well within the capability of one or ordinary skill in the art without resorting to further invention or undue experimentation.

It will be understood that the previous descriptions and explanations are given by way of example, and that numerous changes in the combinations of elements and functions as well as changes in design of the above may be made without departing from the spirit and scope of the invention as hereinafter claimed. In particular, the invention may be practiced in various forms which rely upon trigonometric equalities and identities, and signals may take on either analog or digital form. In addition, it will be useful to combine the functions of the invention with other functions in a fashion so that such functions may be shared between devices or methods.

What is claimed is:

1. An apparatus for multiplying the frequency of a time varying electronic input signal, including in combination a complex to polar means responsive to said input signal to provide a plurality of characteristic signals including a phase signal which is responsive to phase related information of said input signal, a frequency adder means responsive to said phase signal to alter said phase signal to provide an altered phase signal, and a polar to complex conversion means responsive to said altered phase signal and another of said plurality of characteristic signals to output a frequency shifted version of said input signal wherein the amount of said frequency shift is responsive to said altering of said phase signal.

2. An apparatus for multiplying the frequency content of a complex electronic input signal, including in combination a complex to polar means responsive to said input signal to provide a plurality of signals including a magnitude signal representative of the magnitude of said input signal and a phase signal which is representative of the phase of said input signal, a frequency adder means responsive to said phase signal to change the value of said phase signal representing phase thereby producing an altered phase signal, and a polar to complex conversion means responsive to said altered phase signal and said magnitude signal to output a changed frequency content version of said input signal wherein said changed frequency content is responsive to said altering of said phase signal.

3. An apparatus for changing the frequency of an electronic input signal, including in combination a complex to polar means responsive to said input signal to provide a plurality of signals including a magnitude signal responsive to the magnitude of said input signal, and a phase signal which is responsive to the phase of said input signal, said means including a complex to rectangular conversion means, to provide a plurality of rectangular signals, and further containing a rectangular to polar means responsive to said plurality of rectangular signals to provide said magnitude signal and said phase signal, a frequency adder means responsive to said phase signal to change the phase responsive information of said phase signal thereby producing an altered phase signal, and a polar to complex conversion means responsive to said altered phase signal and said magnitude signal to output a changed frequency content version of said input signal wherein said changed frequency content is responsive to said altering of said phase signal.

4. An apparatus for multiplying the frequency of an electronic input signal, including in combination a complex to polar means responsive to said input signal to provide a plurality of signals including a magnitude signal responsive to the magnitude of said input signal, and a phase signal responsive to the phase of said input signal, said means including a complex to rectangular conversion means, responsive to said input signal to provide a plurality of rectangular signals, and further including a rectangular to polar means responsive to said plurality of rectangular signals to provide said magnitude signal and said phase signal, a frequency adder means responsive to said phase signal to change the phase responsive information of said phase signal to and produce an altered phase signal, and a polar to complex conversion means responsive to said altered phase signal and said magnitude signal to output a multiplied frequency version of said input signal wherein said multiplied frequency is responsive to said change of the phase responsive information of said phase signal.

5. The apparatus as claimed in claim 1, 2, 3 or 4 wherein said frequency adder means is responsive to a frequency measurement means responsive to said phase signal such that said altered phase signal is altered by an amount which is responsive to said phase signal.

6. The apparatus as claimed in claims 1, 2, 3 or 4 including in combination a frequency measurement means responsive to said input signal wherein said frequency adder means is responsive to said frequency measurement means such that said altered phase signal is altered by an amount which is responsive to the frequency of said input signal.

7. The apparatus as claimed in claims 1, 2, 3 or 4 including in combination, a frequency measurement means for measuring the rate of change of said phase signal, with said frequency adder means being responsive to said measurement.

8. The apparatus as claimed in claims 1, 2, 3 or 4, including in combination a polar to rectangular converter means responsive to said altered phase signal to provide a plurality of altered rectangular signals, and a vector combination means responsive to said altered rectangular signals to provide the output signal which is the altered version of said input signal.

9. An apparatus for multiplying the frequency of an electronic input signal, including in combination a complex to polar means responsive to said input signal to provide a plurality of signals including a magnitude signal responsive to the magnitude of said input signal, and a phase signal responsive to the phase of said input signal, said means including a complex to rectangular conversion means responsive to said input signal and providing a plurality of rectangular signals, and further including a rectangular to polar means responsive to said plurality of rectangular signals to provide said magnitude signal and said phase signal, a frequency measurement means responsive to said phase signal for measuring the rate of change thereof and providing a frequency signal in response thereto, a frequency adder means responsive to said frequency signal and said phase signal to change the phase responsive information of said phase signal in response to said frequency signal to produce an altered phase signal, a polar to complex conversion means including a polar to rectangular converter means responsive to said magnitude signal and said altered phase signal to provide a plurality of altered rectangular signals, and a vector combination means responsive to said altered rectangular signals to provide the output signal which is the multiplied frequency version of said input signal.

10. A method for changing the frequency of a time changing electronic input signal, including in combination a complex to polar step of converting said input signal to a plurality of signals including a phase signal which represents phase related information of said input signal, a frequency addition step of altering said phase signal to produce an altered phase signal, and a polar to complex conversion step to combine said altered phase signal and one other of said plurality of signals forming a frequency changed version of said input signal wherein the amount of said frequency change is responsive to said altering of said phase signal.

11. A method for multiplying the frequency content of a complex electronic input signal, including in combination a complex to polar step of converting said input signal to provide a plurality of signals including a magnitude signal representative of the magnitude of said input signal, and a phase signal which is representative of the phase of said input signal, a frequency addition step to change the phase represented by said phase signal thereby producing an altered version of said phase signal, and a polar to complex conversion step combining said altered phase signal and said magnitude signal to form a multiplied frequency content version of said input signal wherein said multiplied frequency content is responsive to said change of said phase signal.

12. The method as claimed in claims 10 or 11 wherein said frequency addition step is responsive to a frequency measurement step operating with said phase signal such that said altered phase signal is altered by an amount which is responsive to said phase signal.

13. The method as claimed in claims 10 or 11 including a frequency measurement step operating with said input signal wherein said frequency addition step is responsive to said frequency measurement step such that said altered signal is altered by an amount which is proportional to the frequency of said input signal thereby causing the frequency of the output signal to be linearly related to the frequency of said input signal.

* * * * *